United States Patent
Koepernik et al.

(10) Patent No.: US 11,623,860 B2
(45) Date of Patent: Apr. 11, 2023

(54) INTERPOSER SUBSTRATE, MEMS DEVICE AND CORRESPONDING MANUFACTURING METHOD

(71) Applicant: Robert Bosch GmbH, Stuttgart (DE)

(72) Inventors: Corinna Koepernik, Reutlingen (DE); Joerg Muchow, Munich (DE); Rainer Straub, Ammerbuch (DE); Stefan Mark, Wuerzburg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 403 days.

(21) Appl. No.: 16/765,101

(22) PCT Filed: Nov. 30, 2018

(86) PCT No.: PCT/EP2018/083150
§ 371 (c)(1),
(2) Date: May 18, 2020

(87) PCT Pub. No.: WO2019/137693
PCT Pub. Date: Jul. 18, 2019

(65) Prior Publication Data
US 2020/0346921 A1    Nov. 5, 2020

(30) Foreign Application Priority Data
Jan. 11, 2018   (DE) .................. 102018200371.8

(51) Int. Cl.
*B81B 3/00*   (2006.01)
*B81C 1/00*   (2006.01)
*G02B 26/08*  (2006.01)

(52) U.S. Cl.
CPC ........ *B81B 3/0051* (2013.01); *B81C 1/00531* (2013.01); *G02B 26/0833* (2013.01);
(Continued)

(58) Field of Classification Search
CPC ............ B81B 7/0067; B81B 2201/042; B81B 2203/0181; B81B 1/004;
(Continued)

(56) References Cited

U.S. PATENT DOCUMENTS 8,921,957 B1    12/2014  Zhang et al.
2004/0028566 A1  2/2004  Ko et al.
(Continued)

FOREIGN PATENT DOCUMENTS

DE  102004050051 A1  4/2006
DE  102010062118 A1  5/2012
(Continued)

OTHER PUBLICATIONS

International Search Report for PCT/EP2018/083150, dated Feb. 27, 2019.

*Primary Examiner* — Cara E Rakowski
(74) *Attorney, Agent, or Firm* — Norton Rose Fulbright US LLP; Gerard Messina

(57) ABSTRACT

An interposer substrate, a MEMS device and a corresponding manufacturing method. The interposer substrate is equipped with a front side and a rear side, a cavity starting from the rear side, which extends up to a first depth, a through-opening and a sunken area situated between the cavity and the through-opening, which is sunken from the rear side up to a second depth in relation to the rear side, the first depth being greater than the second depth.

13 Claims, 3 Drawing Sheets

(52) U.S. Cl.
CPC . *B81B 2201/042* (2013.01); *B81B 2203/0315* (2013.01); *B81B 2203/0384* (2013.01)

(58) Field of Classification Search
CPC .......... B81B 2203/0353; B81B 3/0051; B81B 2203/0315; B81C 1/00087; B81C 1/00103; B81C 1/00269; B81C 2203/0118; B81C 2203/0109; B81C 1/00531; G02B 26/0833
See application file for complete search history.

(56) References Cited

U.S. PATENT DOCUMENTS

| | | | |
|---|---|---|---|
| 2006/0144143 A1* | 7/2006 | Gogoi | ................... G01P 15/125 73/504.12 |
| 2011/0236277 A1 | 9/2011 | Lee et al. | |
| 2014/0084394 A1 | 3/2014 | Je | |
| 2017/0210618 A1* | 7/2017 | Chang | ................. B81C 1/00158 |

FOREIGN PATENT DOCUMENTS

| | | |
|---|---|---|
| DE | 102012219591 A1 | 4/2014 |
| WO | 2004017371 A2 | 2/2004 |
| WO | 2008087022 A1 | 7/2008 |
| WO | 2013091939 A1 | 6/2013 |

\* cited by examiner

INTERPOSER SUBSTRATE, MEMS DEVICE AND CORRESPONDING MANUFACTURING METHOD

FIELD

The present invention relates to an interposer substrate, a MEMS device and a corresponding manufacturing method.

BACKGROUND INFORMATION

Although the present invention is applicable to any micromechanical devices and systems, the present invention and its underlying problem are explained on the basis of micromirror devices.

Micromirror devices which include corresponding drives are described, for example, In German Patent Application Nos. DE 10 2012 219 591 A1 and DE 10 2010 062 118 A1, and PCT Application No. WO 2013/091939 A1.

PCT Application No. WO 2004/017371 A2 describes an interposer substrate for a MEMS device as well as a corresponding manufacturing method.

The conventional micromirror devices have a cap wafer situated on the rear side (the side facing away from the micromirror), which mechanically and hermetically caps the drive actuator. This cap wafer has cavities to ensure the freedom of movement of the micromirror as well as stops, which ensure a robustness of the drive actuator.

The cavities for the freedom of movement and the stops of electromagnetic drive actuators of this type or PZT drive actuators are usually manufactured with the aid of a DRIE (deep reactive ion etching) etching process. This time-controlled etching process is subject to manufacturing tolerances of typically +/−15%. For mirrors having a large scanning field, this results in great etching depths of 500 μm, for example.

In addition, hermetic housings and inclined windows are needed in micromirror devices to avoid direct reflection in the image. This is a manufacturing challenge, and special manufacturing steps, such as cavities for the freedom of movement and stops, in wafers or inclined windows threaten the hermeticity and freedom from defects of the glass surface.

SUMMARY

The present invention provides an interposer substrate, a MEMS device, and a corresponding manufacturing method. Preferred refinements of the present invention are described herein.

In accordance with an example embodiment of the present invention, an interposer substrate is provided, which provides a rear-side cavity for the freedom of movement and at least one rear-side sunken area for a stop of an actuator. The formation of a through-opening is further possible in a simple process step, which is used as an access opening for the MEMS device.

According to the present invention, all these functions may be implemented in a single interposer substrate. The manufacturing method of the interposer substrate may utilize the wafer thickness, which has a limited tolerance of a few micrometers, for the freedom of movement and thus reduce the etching time and consequently the cost of the manufacturing process.

The stop planes defined by the sunken area(s) may be manufactured at any depth and in any degree of design freedom. The through-opening may also form space for the freedom of movement of mechanical structures. To implement stop depths of 20 for example, the etching of these 20 μm is the only necessary production step. Very low tolerances may be achieved thereby. Two smooth surfaces exist, the front side and the rear side of the interposer substrate, which correspond to the original surfaces of the substrate material, for example the silicon material. This is an important prerequisite for a hermetic connection between the interposer substrate and other components of the MEMS device, for example an optical base and a micromirror. The manufacturing may take place by wafer bonding.

According to one preferred refinement of the present invention, the sunken area forms a continuous transition area between the cavity and the through-opening. It enlarges the available free space.

According to another preferred refinement of the present invention, multiple cavities are provided, which extend up to the first depth. Multiple movable structures may thus be accommodated.

According to another preferred refinement of the present invention, multiple sunken areas are situated between the cavity and the through-opening, which are sunken from the rear side up to the second depth in relation to the rear side. This permits a precise adaptation to the particular movable structure.

According to another preferred refinement of the present invention, the MEMS substrate includes a movable micromirror device, which is movable into the through-opening, and the through-opening being used as a light outlet area of the micromirror device. The first movable structure and the second movable structure preferably include drive elements for the micromirror device, an optical window device being bonded onto the interposer substrate. The space requirements for the micromirror device may thus be minimized.

According to another preferred refinement of the present invention, an optical detecting device is integrated into the interposer substrate for detecting at least one movement variable, in particular a deflection, of the micromirror device.

This makes it possible to provide information about the driving movement, which is useful for a regulating device.

BRIEF DESCRIPTION OF EXAMPLE EMBODIMENTS

Further features and advantages of the present invention are explained below based on specific embodiments, with reference to the figures.

FIGS. 1a) through 1i) show schematic cross-sectional representations for explaining the process stages of a manufacturing method for an interposer substrate according to a first specific embodiment of the present invention.

DETAILED DESCRIPTION OF EXAMPLE EMBODIMENTS

Figure 1A:
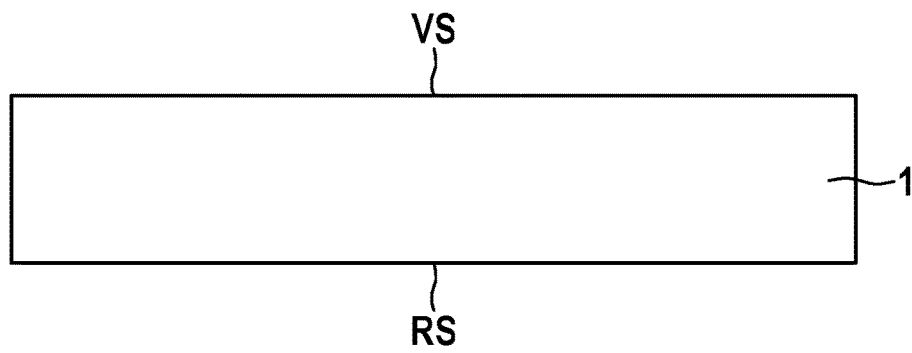

In the figures, the same reference numerals designate identical or functionally identical elements.

FIGS. 1a) through 1i) show schematic cross-sectional representations for explaining the process stages of a manufacturing method for an interposer substrate according to a first specific embodiment of the present invention.

The starting point according to FIG. 1a) for the manufacturing method according to the first specific embodiment is an unstructured interposer substrate 1, which has a front side VS and a rear side RS. For example, a common Si raw wafer may be used as the interposer substrate. The crystal direction may be selected according to the application, for example the 110 direction, in this 110 direction square holes being generated in the 110 direction during the anisotropic etching process.

Figure 1B:
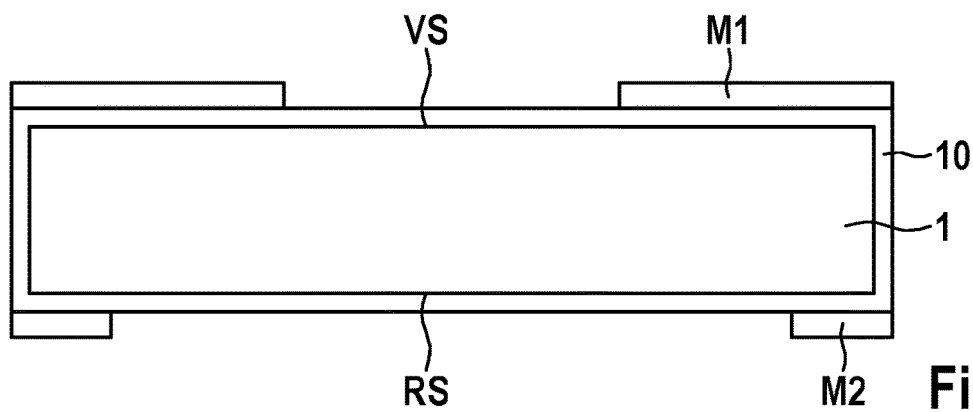

With reference to FIG. 1b), an all-around application of a first protective layer 10 further takes place, e.g. with the aid of thermal oxidation or by depositing SiN. An application of a first mask M1 onto front side VS then takes place, which defines through-opening V to be manufactured later on (cf. FIG. 1h)).

In a subsequent process step, a second mask M2 is applied to rear side RS, which defines the area of the cavities to be manufactured later on (cf. FIG. 1e)).

Figure 1C:
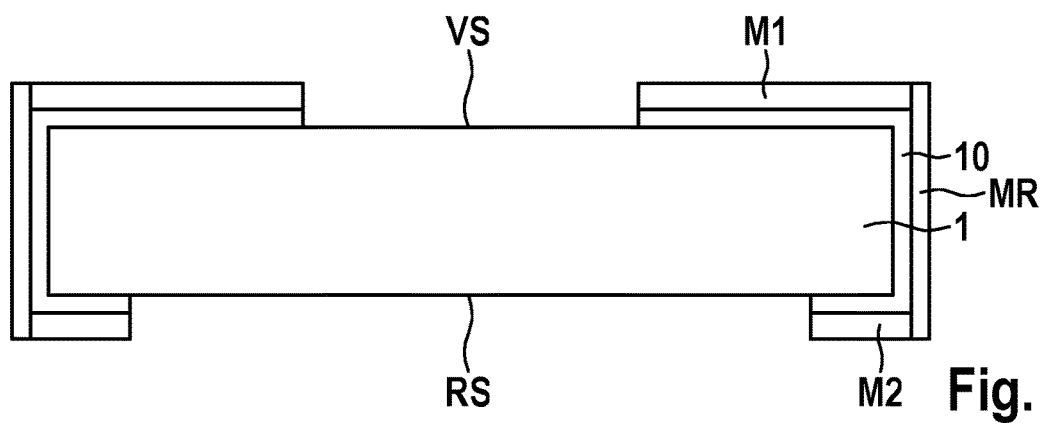

In addition, an edge coating with an edge coating layer MR is applied after the application of first mask M1 and second mask M2, for example, by typical lithography, to protect the wafer edge during the later structuring steps. Afterwards, as illustrated in FIG. 1c), first protective layer 10 on front side VS and rear side RS is removed from where first or second mask M1, M2 is open.

Figure 1D:
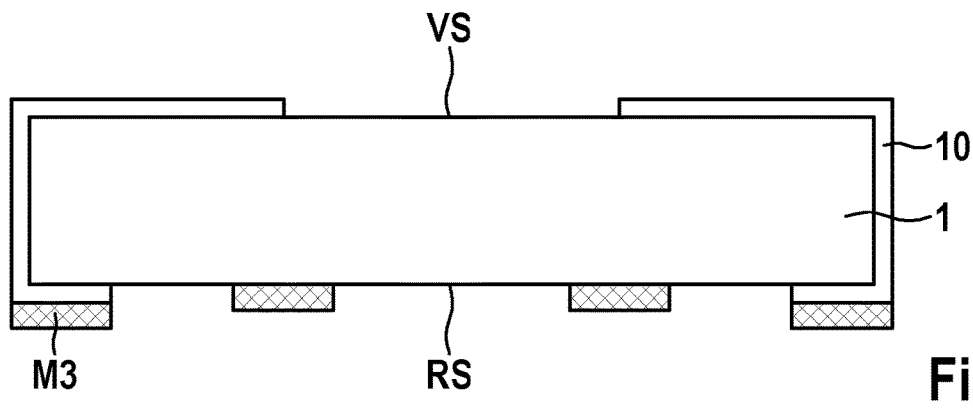

According to FIG. 1d), first mask M1 and second mask M2 as well as edge coating MR are subsequently removed, and a third mask M3 is provided on rear side RS, which is used to subsequently structure the cavities to be formed.

Figure 1E:
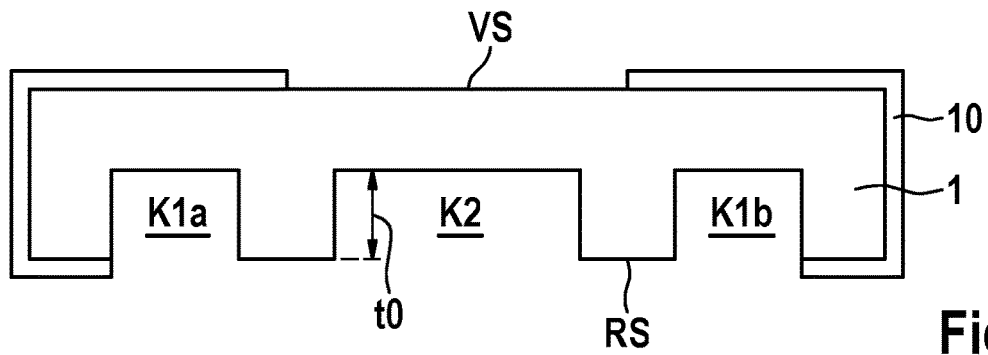

Furthermore, with reference to FIG. 1e), first cavities K1a, K1b and a second cavity K2 are formed from rear side RS up to an intermediate depth t0 with the aid of a DRIE etching process. Third mask M3 protects sunken areas ST1, ST2 to be formed later on. Subsequent to this first DRIE etching step, third mask M3 is removed from rear side RS after reaching intermediate depth t0.

Figure 1F:
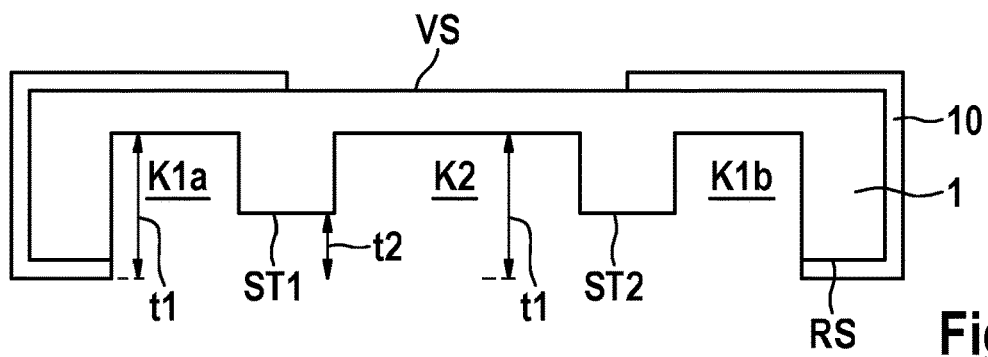

A second DRIE etching step takes place in the process step according to FIG. 1f), first cavities K1a, K1b and second cavity K2 being simultaneously formed from rear side RS up to a first depth t1, and sunken areas ST1, ST2 simultaneously being formed, which are sunken up to a second depth t2 in relation to rear side RS, first depth t1 being greater than second depth t2.

Figure 1G:
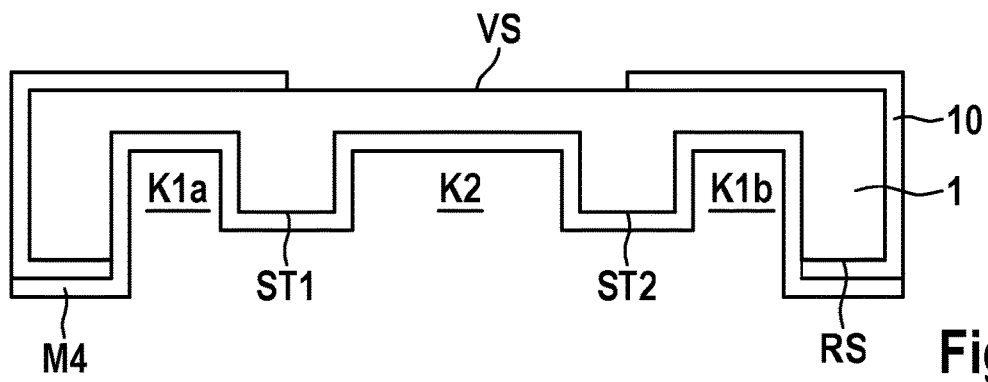

According to FIG. 1g), a second protective layer M4 is subsequently deposited into rear side RS having first cavities K1a, K1b and second cavity K2, for example a silicon nitride layer (SiN) deposited with the aid of PECVD.

Figure 1H:
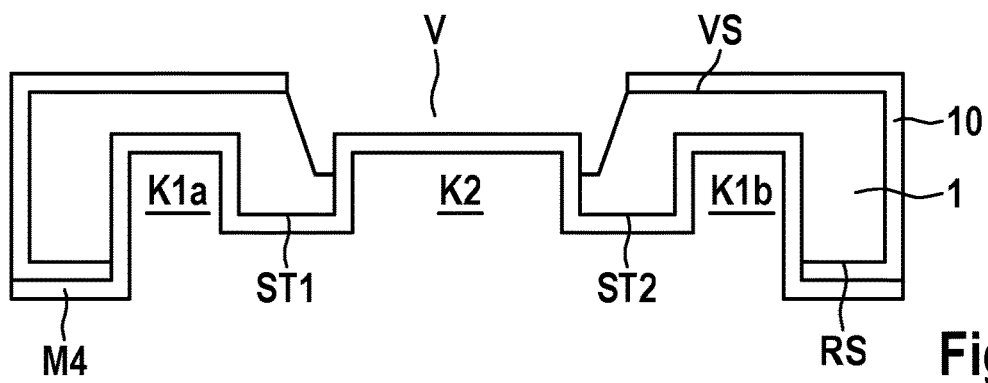

A front-side wet etching with the aid of KOH then takes place to form a through-opening V, starting from front side VS, the KOH etching stopping at protective layer M4, as illustrated in FIG. 1h).

Figure 1I:
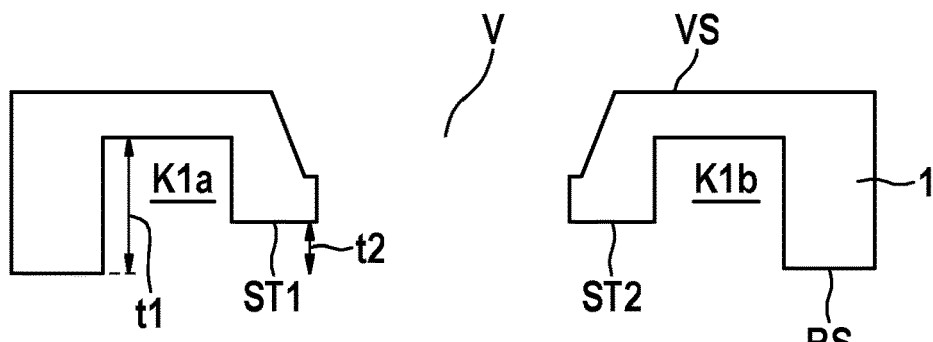

Finally, with reference to FIG. 1i), protective layer M4 is removed from rear side RS, and protective layer 10 is removed from the remaining part of interposer substrate 1, which results in the final structure of interposer substrate 1. Second cavity K2 no longer exists after the removal of protective layer M4.

With the aid of the described manufacturing method, it is possible to structure sunken areas ST1, ST2 and first cavities K1a, K1b in any design, the selected design depending on the structure of the MEMS device situated thereunder later on.

The combination of the two DRIE etching steps with the intermediate removal of third mask M3 makes it possible for first cavities K1a, K1b to be sunken to first depth t1, which is greater than second depth t2 of sunken areas ST1, ST2.

Figure 2:
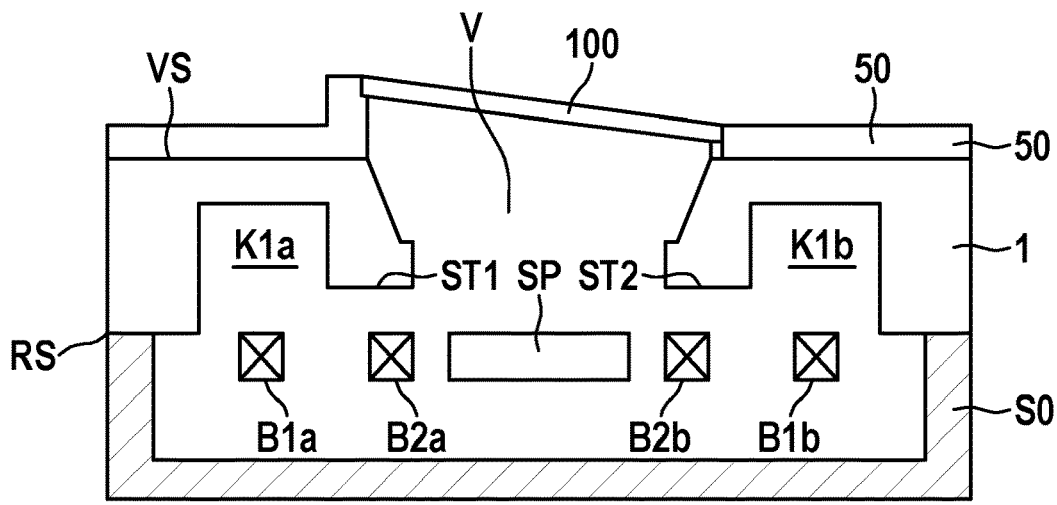
FIG. 2 shows a schematic cross-sectional representation of a MEMS device, including an interposer substrate, according to a second specific embodiment of the present invention.

FIG. 2 shows a schematic cross-sectional representation of a MEMS device, including an interposer substrate, according to a second specific embodiment of the present invention.

As illustrated in FIG. 2, interposer substrate 1 according to FIG. 1i) is bonded by its rear side RS to a MEMS substrate S0, which includes a first movable structure B1a, B1b and a second movable structure B2a, B2b as well as a micromirror device SP.

First movable structure B1a, B1b and second movable structure B2a, B2b include a drive and a suspension of micromirror device SP and are deflected from the bonding plane of MEMS substrate S0 in the direction of interposer substrate 1 during operation.

The orientation is such that first movable structure B1a, B1b is movable into first cavities K1a, K1b, and sunken areas ST1, ST2 act as stop areas for second movable structure B2a, B2b.

Micromirror device SP is movable into through-opening V by tilting, through-opening V acting as a light outlet area for micromirror device SP.

An optical window device 50, 100 is also bonded onto interposer substrate 1, which includes a window frame 50 and a window glass 100.

Since, in the present second specific embodiment, the micromirror device is movable into through-opening V, and first movable structure B1a, B1b is movable into first cavities K1a, K1b, and sunken areas ST1, ST2 act as stop areas for second movable structure B2a, B2b, the arrangement is more space-efficient compared to conventional cap structures with respect to its thickness.

Figure 3:
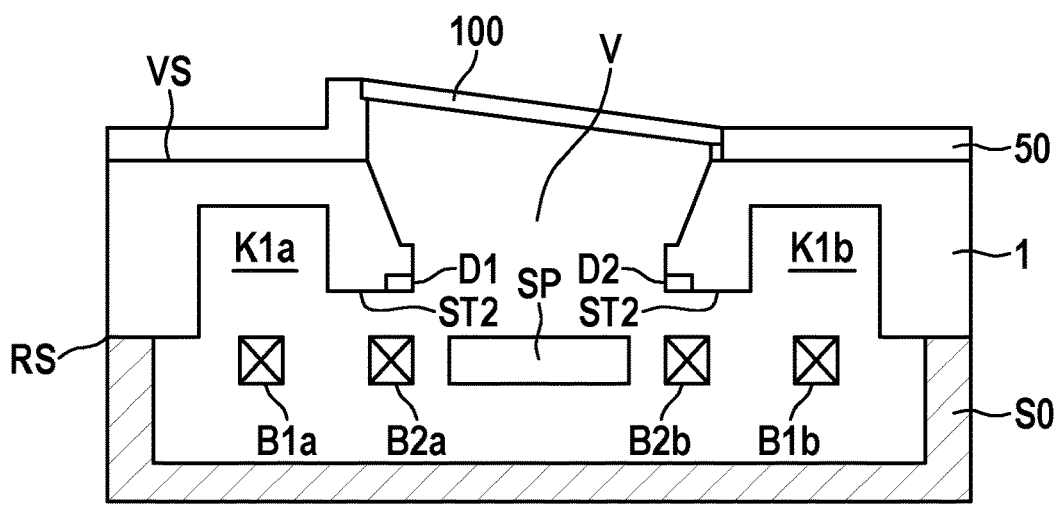
FIG. 3 shows a schematic cross-sectional representation of a MEMS device, including an interposer substrate, according to a third specific embodiment of the present invention.

FIG. 3 shows a schematic cross-sectional representation of a MEMS device, including an interposer substrate, according to a third specific embodiment of the present invention.

In the third specific embodiment, optical detecting devices D1, D2 are additionally integrated into the interposer substrate in the area of through-opening V within stop areas ST, ST2, which include, for example, photodiodes. The manufacturing may take place, for example, after the second DRIE etching step. It is also possible to provide optical detecting devices D1, D2 in non-sunken areas of rear side RS, the corresponding processing being able to take place before the remaining structuring steps. The manufacture of diodes D1, D2 before the structuring on a planar surface makes the processing easier, since no corresponding protective layers need to be provided later on.

Optical detecting devices D1, D2 are used to detect at least one movement variable, in particular a deflection, of micromirror device SP. Information of this type about the present radiation profile makes it possible to supply a valuable input signal for a control loop. In particular, the maximum deflection of micromirror device SP is of interest for regulating the scanning range.

Although the present invention was described on the basis of preferred exemplary embodiments, it is not limited thereto. In particular, the materials and topologies mentioned are only examples and are not limited to the explained examples.

Although the above specific embodiments were explained on the basis of MEMS devices, including micromirror devices, the interposer substrate may, of course, also be used for other micromechanical actuators and sensors, in which movable structures are tilted out of the MEMS substrate plane, such as a z rocker for acceleration sensors or acceleration or rotation rate sensors having one or multiple rotational degrees of freedom.

What is claimed is:

1. An interposer substrate, comprising:
   a front side and a rear side;
   a first cavity starting from the rear side which extends to a first depth;
   a second cavity starting from the rear side which extends to the first depth;
   a through-opening situated above the second cavity; and
   a sunken area situated between the first cavity and the through-opening, which is sunken from the rear side to a second depth in relation to the rear side;
   wherein the first depth is greater than the second depth,
   wherein the interposer substrate is bonded by the rear side to a MEMS substrate, wherein the MEMS substrate includes a first movable structure, a second movable structure, and a micromirror device.

2. The interposer substrate as recited in claim 1, wherein the sunken area forms a continuous transition area between the first cavity and the through-opening.

3. The interposer substrate as recited in claim 1, wherein the interposer substrate includes more than two cavities which extend to the first depth.

4. The interposer substrate as recited in claim 1, wherein the interposer substrate includes multiple sunken areas situated between the first cavity and the through-opening, which are sunken from the rear side to the second depth in relation to the rear side.

5. A MEMS device, comprising:
   an interposer substrate having a front side and a rear side, a cavity starting from the rear side which extends to a first depth, a through-opening, and a sunken area situated between the cavity and the through-opening, which is sunken from the rear side to a second depth in relation to the rear side, wherein the first depth is greater than the second depth;
   a MEMS substrate which includes a first movable structure and a second movable structure;
   wherein the interposer substrate is bonded onto the MEMS substrate in such a way that the first movable structure is movable into the first cavity, and the sunken area acts as stop area for the second movable structure.

6. The MEMS device as recited in claim 5, wherein the MEMS substrate includes a movable micromirror device, which is movable into the through-opening, and the through-opening is used as a light outlet area of the micromirror device.

7. The MEMS device as recited in claim 6, wherein the first movable structure and the second movable structure include drive elements for the micromirror device.

8. The MEMS device as recited in claim 5, wherein an optical window device is bonded onto the interposer substrate.

9. The MEMS device as recited in claim 5, wherein an optical detecting device is integrated into the interposer substrate and is configured to detect at least one movement variable of the micromirror device.

10. The MEMS device as recited in claim 9, wherein the at least one movement variable includes a deflection of the micromirror device.

11. A manufacturing method for an interposer substrate, comprising the following steps:
    providing an unstructured interposer substrate which has a front side and a rear side;
    forming a first cavity starting from the rear side, which extends to a first depth;
    forming a second cavity starting from the rear side, which extends to the first depth;
    forming a sunken area situated between the first cavity and the second cavity, which is sunken from the rear side to a second depth in relation to the rear side, wherein the first depth is greater than the second depth; and
    forming a through-opening, starting from the front side, by removing an area of the interposer substrate situated above the second cavity,
    wherein the interposer substrate is bonded by the rear side to a MEMS substrate, wherein the MEMS substrate includes a first movable structure, a second movable structure, and a micromirror device.

12. A manufacturing method for an interposer substrate, comprising the following steps:
    providing an unstructured interposer substrate which has a front side and a rear side;
    forming a first cavity starting from the rear side, which extends to a first depth;
    forming a second cavity starting from the rear side, which extends to the first depth;
    forming a sunken area situated between the first cavity and the second cavity, which is sunken from the rear side to a second depth in relation to the rear side, wherein the first depth is greater than the second depth; and
    forming a through-opening, starting from the front side, by removing an area of the interposer substrate situated above the second cavity,
    wherein the first cavity and the second cavity are simultaneously formed in a first etching step starting from the rear side to an intermediate depth, and an area of the rear side corresponding to the sunken area to be formed later on is masked, and the first cavity and the second cavity are simultaneously formed in a second etching step from the rear side up to a first depth, and the sunken area is simultaneously formed.

13. A manufacturing method for an interposer substrate, comprising the following steps:
    providing an unstructured interposer substrate which has a front side and a rear side;
    forming a first cavity starting from the rear side, which extends to a first depth;
    forming a second cavity starting from the rear side, which extends to the first depth;
    forming a sunken area situated between the first cavity and the second cavity,
    which is sunken from the rear side to a second depth in relation to the rear side,
    wherein the first depth is greater than the second depth; and
    forming a through-opening, starting from the front side, by removing an area of the interposer substrate situated above the second cavity,
    wherein, after the formation of the first cavity and the second cavity and the sunken area, a protective layer is deposited on the rear side before the through-opening is formed.

* * * * *